United States Patent [19]
Kwong

[11] Patent Number: 5,717,343
[45] Date of Patent: Feb. 10, 1998

[54] HIGH-DRIVE CMOS OUTPUT BUFFER WITH NOISE SUPRESSION USING PULSED DRIVERS AND NEIGHBOR-SENSING

[75] Inventor: David Kwong, Fremont, Calif.

[73] Assignee: Pericom Semiconductor Corp., San Jose, Calif.

[21] Appl. No.: 685,142

[22] Filed: Jul. 23, 1996

[51] Int. Cl.$^6$ .................. H03K 19/0948; H03K 17/16
[52] U.S. Cl. .................. 326/27; 326/83; 326/121
[58] Field of Search .................. 326/86–87, 26–27, 326/83, 121; 327/170, 380–381, 387, 391

[56] References Cited

U.S. PATENT DOCUMENTS

| | | | |
|---|---|---|---|
| 5,212,801 | 5/1993 | Farmer | 326/27 |
| 5,241,221 | 8/1993 | Fletcher et al. | 326/121 |
| 5,268,868 | 12/1993 | Kajigaya et al. | 365/206 |
| 5,296,758 | 3/1994 | Sandhu . | |
| 5,319,252 | 6/1994 | Pierce et al. . | |
| 5,319,260 | 6/1994 | Wanlass . | |
| 5,341,040 | 8/1994 | Garverick et al. . | |
| 5,347,177 | 9/1994 | Lipp . | |
| 5,410,262 | 4/1995 | Kang | 327/170 |
| 5,424,653 | 6/1995 | Folmsbee et al. | 326/26 |
| 5,438,277 | 8/1995 | Sharpe-Geisler | 326/27 |
| 5,559,447 | 9/1996 | Rees | 326/86 |

*Primary Examiner*—John Santamauro
*Attorney, Agent, or Firm*—Stuart T. Auvinen

[57] ABSTRACT

A CMOS output buffer has a first stage with smaller driver transistors and a second stage having larger driver transistors. Both stages drive the output in parallel during the first half of a voltage transition, but the larger, second stage is disabled during the second half of the output voltage swing. The output voltage is fed back to an isolation circuit by a pulse generator which is triggered by the output reaching the switching threshold. The pulse generated disables the larger driver for a short period of time but later re-enables the driver. Thus the large driver remains on after the switching is complete, providing large IOH and IOL static currents. The pulse is long enough to keep the large driver disabled while reflections are received and ringing occurs after the voltage transition. Resistors in the smaller first stage absorb these reflections. The output impedance is pulsed to the higher impedance of the first stage when ringing occurs at the end of the voltage transition, but after the pulse ends the lower impedance of the large driver is seen. Pulses are sent to neighboring output buffers and are OR'ed together to disable adjacent output buffer's large drivers when noise in injected into the power or ground supplies.

17 Claims, 6 Drawing Sheets

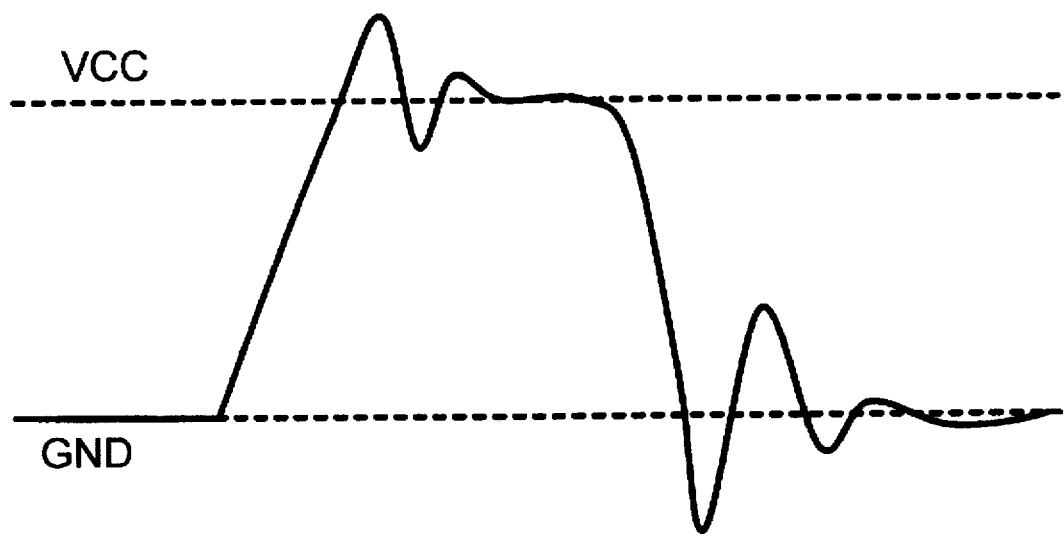
PRIOR ART  FIG. 1
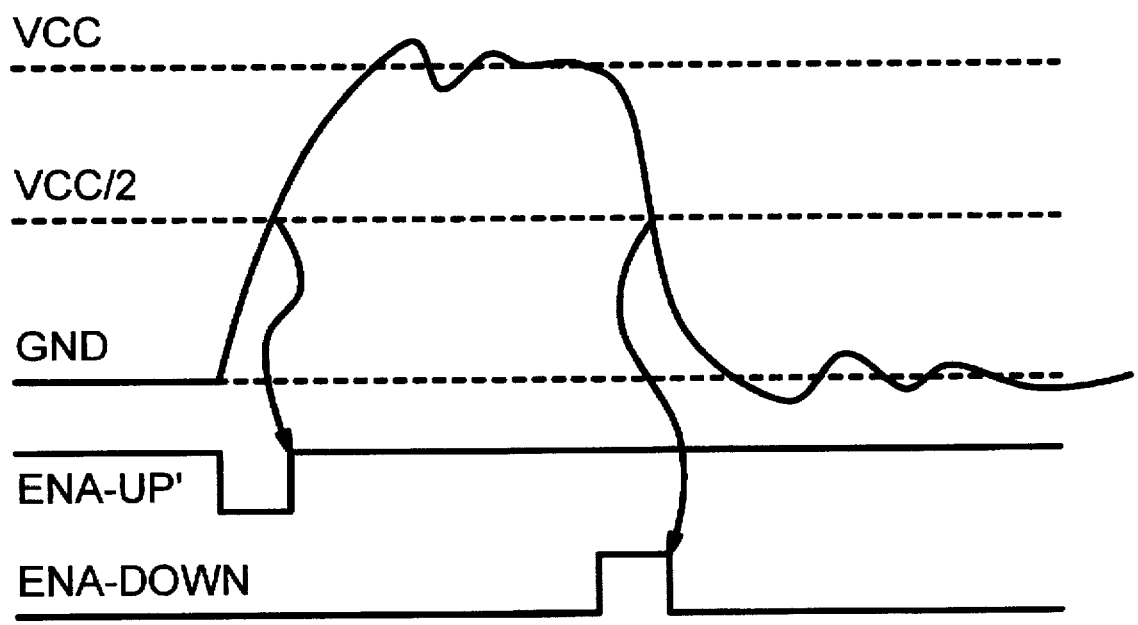
FIG. 2

HIGH-DRIVE CMOS OUTPUT BUFFER WITH NOISE SUPRESSION USING PULSED DRIVERS AND NEIGHBOR-SENSING

BACKGROUND OF THE INVENTION

1. Field of the Invention

This invention relates to CMOS output buffers, and more particularly to low-noise and impedance-adjusting output buffers.

2. Description of the Related Art

Demand for higher-performance systems has increased speed and current requirements for complementary metal-oxide-semiconductor (CMOS) interface logic ("glue" logic). Higher current drive increases speed because load capacitances are more quickly charged or discharged. Unfortunately, unwanted noise often increases too.

Higher-drive output buffers of CMOS chips often produce a type of noise known as ground bounce, due to rapid changes in current through the parasitic inductance's of the integrated circuit (IC) package. These inductance's resist changes in current by changing the voltages on power or ground supplies. Such voltage changes can falsely trigger logic within the IC device, or other devices in the system.

The rate of voltage change of the output, the edge rate, increases for these faster devices. The high edge rate can reflect off the ends of printed-circuit-board (PCB) wiring traces driven by the output buffer. These reflections produce voltage variations known as undershoot, overshoot, and ringing (oscillation). Careful layout of these wiring traces is needed to minimize trace-ends that can cause reflections. Termination devices such as resistors to ground at the ends of the traces are often used to absorb the reflection-causing wave front produced by the high edge rate.

Dampening resistors are sometimes used. Dampening resistors are resistors in series on the wiring trace rather than to power or ground. Dampening resistors reduce or slow down the high edge rate as well as any reflections. While discrete dampening resistors are often used, the output buffer itself provides some impedance which also acts as a dampening resistor. Unfortunately, this impedance decreases with higher-current-drive output buffers. The lower impedance of these output buffers creates a greater mis-match between the output buffer's impedance and the impedance of the wiring trace.

FIG. 1 is a diagram of a waveform of a prior-art high-drive output buffer driving a PCB wiring trace. The high current drive of the output buffer produces a high edge rate which rapidly changes the output voltage from ground to the power-supply voltage, Vcc. The high edge rate produces a wave front which travels down the wiring trace and reflects off one or more ends. The reflected wave from then travels back up the wiring trace to the output buffer, and raises the voltage at the output buffer when the reflected wave arrives. The raised voltage is above Vcc and is known as an overshoot. This reflected wave then reverses direction and travels back to the end of the wiring trace, is reflected, and again reaches the output buffer, producing a series of both overshoots and undershoots, known as ringing. Since the reflected wave is dampened and loses energy at each reflection, the amplitude of the ringing gradually decreases. Low-going ringing (undershoot) is caused by a mis-match in impedance. Multiple reflections interfere with each other and cause the ringing.

When the output buffer switches from high to low, another high-edge rate wave travels down the wiring trace and is reflected back, producing undershoot and more ringing. This undershoot can cause ground bounce inside the output buffer's IC.

When the ringing and over/undershoot is large, logic can read a static signal as low when the static signal is actually high. For example, a static 3-volt signal input to another pin of the IC is a high signal, but when the internal ground of the IC bounces up from 0 volt to 2 volt, the static 3-volt signal appears to be a 1-volt signal, a low input. When the input signal is connected to a latch or flip-flop, the false low can be latched in, causing an error. Thus noise is a serious problem.

Several prior-art solutions to these problems are known. For example, Pierce et al., U.S. Pat. No. 5,319,252, assigned to Xilinx Inc. of San Jose, Calif., discloses an output buffer which gradually turns output buffers on and off so that there is no sharp discontinuity in the current flow. The output voltage is fed back to gradually turn off the output buffer at the end of the voltage transition. Lipp in U.S. Pat. No. 5,347,177, discloses a closed-loop trace which is driven by output buffers with level-sensitive impedance control. Sharpe-Geisler, U.S. Pat. No. 5,438,277, assigned to Advanced Micro Devices of Sunnyvale, Calif., discloses an output buffer using two pull-down devices. A noisy pull-down device is connected to a noisy ground (having ground bounce) while a quiet pull-down device is connected to a quiet ground. A one-shot triggered by an internal signal first switches on the noisy pull-down, then turns off the noisy pull-down and turns on the quiet pull-down.

What is desired is an output buffer with high current drive and high speed. It is desired to reduce noise from the fast edge rate, such as ringing, undershoot, overshoot, and ground bounce. It is desired to dynamically control the impedance of the output buffer to provide low impedance as the output voltage is rapidly changing, but high impedance when the reflected wave front is received to dampen the reflections. It is also desired to leave the larger drivers on during static periods to provide strong IOH and IOL output currents but have these drivers turn off during the critical ringing period. It is further desired to disable neighboring pins' output buffers when one output buffer switches to prevent noise coupling into other pin's outputs.

SUMMARY OF THE INVENTION

An impedance-switching output buffer has a low-impedance stage for driving current to an output. A higher-impedance stage also drives current to the output. A pulse generator is coupled to the output. It generates a pulse when the current driven to the output by the low-impedance stage and the higher-impedance stage switches the output to a predetermined voltage between a ground voltage and a power-supply voltage. Disable means receives the pulse from the pulse generator and disables the low-impedance stage in response to the beginning of the pulse and re-enables the low-impedance stage in response to the end of the pulse. Both the low-impedance stage and the higher-impedance stage are enabled to drive current to the output after the end of the pulse. Thus static current is provided by both the low-impedance stage and the higher-impedance stage.

In further aspects of the invention the low-impedance stage has a pull-up MOS transistor connected to conduct current between a power supply and a the output. A pull-down MOS transistor is connected to conduct current between a ground supply and the output. The higher-impedance stage has a first resistor connected between the output and to a first node and a second resistor connected between the output and to a second node. A pull-up MOS transistor is connected to conduct current between the power supply and the first node. A pull-down MOS transistor is connected to conduct current between the ground supply and the second node. Thus the first resistor and the second resistor increase impedance of the output buffer and absorb reflections when the low-impedance stage is disabled by the pulse.

In further aspects the disable means has an isolation means which receives the pulse. It disconnects a control gate of the low-impedance stage from a control gate of the higher-impedance stage in response to the pulse. Tie off means receives the pulse and drives a disabling voltage onto the control gate of the low-impedance stage. The disabling voltage prevents current from flows through the low-impedance stage to the output. Thus the low-impedance stage is isolated and disabled by the pulse.

In still further aspects of the invention neighbor logic means receives neighbor pulses from neighboring output buffers. The neighboring output buffers include means for generating neighbor pulses when a neighboring output switches to the predetermined voltage between the ground voltage and the power-supply voltage. The neighbor logic means outputs a neighbor switch pulse when one or more of the neighbor pulses is received.

Neighbor isolation means is coupled to receive the neighbor switch pulse from the neighbor logic means. It disconnects the control gate of the low-impedance stage from the control gate of the higher-impedance stage in response to the neighbor switch pulse. Neighbor tie off means receives the neighbor switch pulse and drives the disabling voltage onto the control gate of the low-impedance stage. The disabling voltage prevents current from flows through the low-impedance stage to the output. Thus the low-impedance stage is isolated and disabled by the neighbor switch pulse when a neighbors output buffers switches.

BRIEF DESCRIPTION OF THE DRAWINGS

FIG. 1 is a diagram of a waveform of a prior-art high-drive output buffer driving a PCB wiring trace.

FIG. 2 is a waveform diagram of the output buffer of FIG. 3 which enables the larger transistors only during the first part of the voltage transition.

DETAILED DESCRIPTION

The present invention relates to an improvement in CMOS output buffers. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Two Parrallel Stages Drive Output

An output buffer can be constructed with two push-pull stages: a first, smaller stage is connected to quiet power and ground supplies which have little bounce or noise, and a second stage with larger transistors connected to noisy power and ground, which have significant bounce and noise. The internal portions of the integrated circuit (IC) chip are not connected to the noisy power and ground, but may be connected to the quiet power and ground, or to entirely separate power and ground pins.

This output buffer is controlled by enabling the larger, noisy transistors only during the first part of the voltage transition. These large transistors are disabled as the final voltage is reached and must be disabled when reflected waves return to the output buffer, when overshoot, undershoot, and ringing normally occur.

Larger Drivers Enabled During First Half of Voltage Swing

Figure 3:
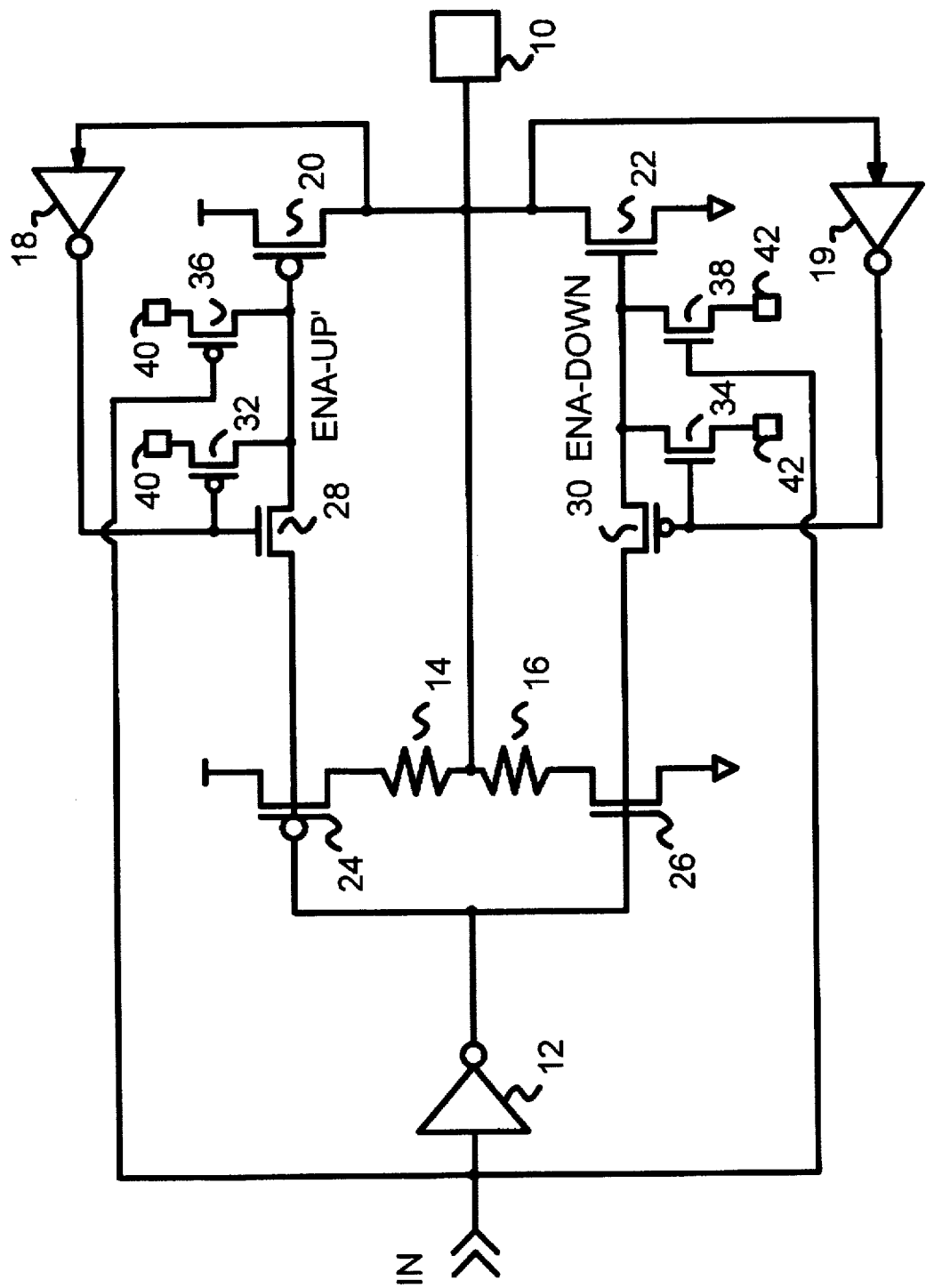
FIG. 3 is a schematic of an output buffer with impedance control using feedback.

FIG. 2 is a waveform diagram of the output buffer of FIG. 3 which enables the larger transistors only during the first part of the voltage transition. When internal signal IN changes, indicating that the output should change, the large driver transistor is enabled. Signal ENA-UP' drives the gate of a large PMOS pull-up transistor, while signal ENA-DOWN drives the gate of a large NMOS pull-down transistor. As the output voltage reaches the logic switching threshold, about Vcc divided by 2, the large driver transistor is disabled and the smaller driver transistor continues to drive the signal to either power or ground. The rate of voltage change is reduced as the output voltage nears the power-supply or ground voltage. This reduction in edge rate occurs after the switching threshold is reached, and thus does not slow down switching delays.

The softer edge reduces the reflection and thus ringing and over and under shoot are also reduced. Additionally, dampening resistors are added to the second stage to dampen the reflected waves.

FIG. 3 is a schematic of an output buffer with impedance control using feedback. An internal input signal IN is buffered by inverter 12 which drives the gates of transistors 24, 26 in a first stage and the gates of transistors 20, 22 in a large, second stage. The internal input signal IN is also connected to the gates of disable transistors 36, 38. Output pin 10 is driven by the drains of large driver transistors 20, 22 during the initial part of a voltage transition. Output pin 10 is driven by the drains of smaller driver transistors 24, 26 during the initial part of the voltage transition and during the later part of the voltage transition.

Resistors 14, 16 are in series with the output and thus server to increase the output impedance. The higher output impedance helps dampen reflected waves and reduce ringing. Resistors 14, 16 are sized to provide a matching impedance to the characteristic impedance of the wiring trace attached to output pin 10. The impedance of resistor 14 and small driver transistor 24 is targeted to 30 to 40 ohms, while impedance of resistor 16 and small driver transistor 26 is targeted to 25 to 35 ohms.

The impedance of the output buffer is dynamically changed or tuned as the output voltage changes. Initially, both the first and second stages are driving, and the large size of the second stage transistors 20, 22 provides a low impedance and high current drive to rapidly switch the voltage to the switching threshold, Vcc/2. Later, after Vcc/2 is reached, the larger second stage is switched off, and the impedance increases to the larger impedance of the first stage with small driver transistors 24, 26 and resistors 14, 16. Thus higher impedance is provided near the end of the output voltage transition, before ringing occurs. The higher impedance absorbs the reflected waves, reducing ringing.

Feedback is used to dynamically change the impedance by disabling the larger first stage as Vcc/2 is reached. Feedback inverters 18, 19 are CMOS inverters which switch their outputs at the switching threshold of about Vcc/2. Isolation transistors 28, 30 then isolate the gates of second-stage driver transistors 20, 22 from the output of inverter 12, disabling these driver transistors.

On the low-going voltage transition of output pin 10, the output of inverter 12 becomes high, at Vcc. This high voltage disables PMOS driver transistor 24 in the first stage. Driver transistor 20 in the second stage is already disabled, since the output voltage is initially high, and the output of feedback inverter 18 is low, causing isolation transistor 28 to not conduct current, and transistor 32 to pull the gate of large driver transistor 20 (signal ENA-UP') to the power-supply voltage. The low input signal IN to the gate of transistor 36 also pulls ENA-UP' high.

The low input signal IN causes disable transistor 38 to no longer pull ENA-DOWN low. The initially high output pin 10 is inverted by feedback inverter 19 to a low voltage, which causes isolation transistor 30 to conduct, connecting ENA-DOWN to the output of inverter 12. Disable transistor 34 is turned off. Thus large driver transistor 22 has a high voltage on its gate and conducts, as does small driver transistor 26. Both pull the output low, until the switching threshold is reached at half of the voltage swing.

When the output falls to Vcc/2, the half-way point of the voltage swing, feedback inverters 18, 19 drive their outputs high. This turns off isolation transistor 30 and turns on disable transistor 34, allowing the gate of large driver transistor 22 to be pulled low. This shuts off large driver transistor 22.

Only small driver transistor 26 of the first stage continues to drive the output low until ground is reached. Resistor 16 increases the output impedance, helping to absorb reflections. Thus a fast switching time is achieved while still providing a higher impedance to absorb reflections.

Pull-down driver transistors 26, 22 are both connected to a noisy ground, while pull-up driver transistors 24, 20 are connected to a noisy power supply. Since both the first and the second driver stages are connected to the noisy supplies, both stages can be used to drive the output during the initial voltage swing. This increases switching speed. Internal signals and components such as inverter 12 and feedback inverters 18, 19 are connected to separate, quiet supplies to minimize the effects of ground bounce. The gates of the driver transistors are driven from the quiet supplies, minimizing bounce-induced ringing. Disable transistors 32, 36 are also connected to quiet power-supply 40, while disable transistors 34, 38 are connected to quiet ground 42.

The high-going transition of the output behaves in a corresponding manner. Pull-up driver transistors 24, 20 both turn on initially since isolation transistor 28 is conducting. Once the output rises from ground to Vcc/2, feedback inverter 18 senses a high input and switches its output to low, isolating the gate of large driver transistor 20 from the input. Disable transistor 32 then pulls the gate node ENA-UP' high to disable large pull-up driver transistor 20. Smaller pull-up transistor 24 then continues to pull output pin 10 high, with resistor 14 dampening reflected waves.

Both stages drive the output during the initial part of the voltage transition. This allows the larger driver transistors 20, 22 to be made smaller by the size of first-stage transistors 24, 26. Both stages contribute to driving the output during the speed-critical first portion of the output swing. The higher impedance of the smaller first stage is seen at the end of the voltage transition when ringing occurs. The first stage acts as active termination of the PCB wiring trace.

Large Driver Transistors Need to be On for Static IOH, IOL

The inventor has realized that the large, high-drive transistors only need to be disabled during the end of the voltage transition and while reflected waves are returning to the output buffer. Once ringing has dished, the large transistors can be re-enabled. Leaving these large transistors on provides high static output current, such as IOL and IOH. Large IOH and IOL requirements occur when driving a backplane bus or older TTL components which sink and source static current.

In the prior art, the one-shot enables these large transistors for just a short period of time at the beginning of the voltage transition, but disables the large transistors during all other times, including when no transitions occur. Thus the static current, IOH and IOL, are limited by the quiet, smaller transistors since the larger transistors are disabled at all times except during the voltage swing. Indeed, Sharp-Geisler (U.S. Pat. No. 5,438,277, col. 7, lines 51–64) has to increase the size of the quiet pull-down transistor to 25 microns, while the noisy pull-down transistor is only 10 microns. Thus the quiet pull-down transistor is actually larger than the noisy transistor, probably due to IOL requirements. The opposite is true for his pull-up transistors: the noisy pull-up is 60 microns while the quiet pull-up is 10 microns. The size of the pull-down transistors is reversed apparently due to the higher IOL requirement than the IOH requirement on many TTL-compatible IC's.

This has a drawback that the larger noisy transistors couple noise to the quiet output pin. The ground-bounce control benefits are thus negated.

Figure 4:
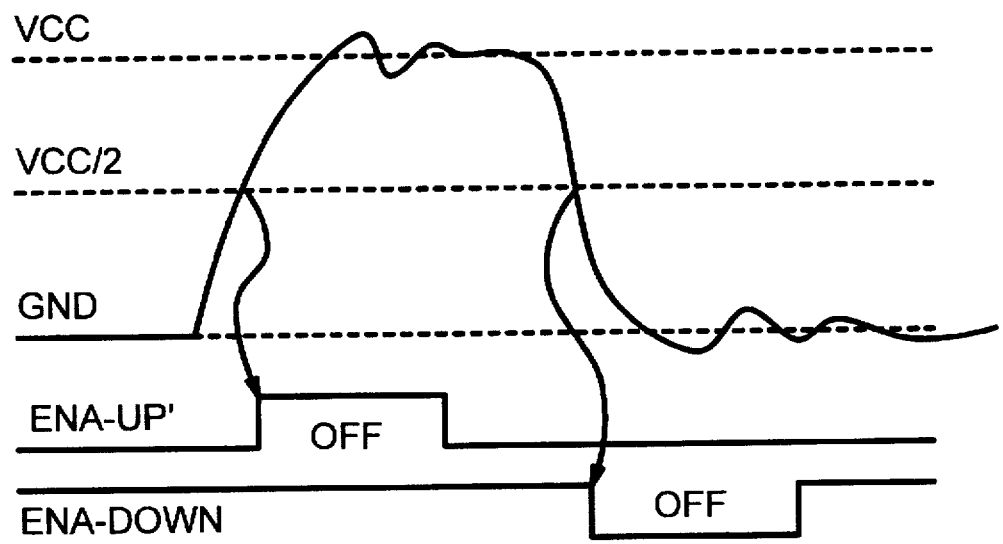
FIG. 4 is a waveform diagram of the output buffer of FIG. 3 which disables the large driver transistors during the end of the voltage transition and when ringing occurs.

Timing for Pulse-Disabled Large Drivers—FIG. 4

FIG. 4 is a waveform diagram of the output buffer of FIG. 3 which disables the large driver transistors during the end of the voltage transition and when ringing occurs. The large driver transistors in the second stage are normally on (rather than normally off) but are pulsed off at the critical time when reflections are received. Thus the output buffer is in a higher impedance state during the ringing period by pulsing off the low-impedance second-stage drivers.

The large pull-up driver is disabled by a pulse of ENA-UP' which begins when the output rises to Vcc/2. The length of the pulse is set by logic delays in a pulse generator. The length of the pulse is designed to be long enough to keep the large driver transistor off for the second half of the voltage transition, and the period of time when the larger reflections are received. The exact length of the period is not critical, but about 10 nano-seconds it typical for current IC technology. Since static current is measured over a long period of time, perhaps several milli-seconds, the pulse can last 5 to 15 nano-seconds, but less than the minimum cycle period of the output signal.

The large pull-down driver is disabled by a low-going pulse of ENA-DOWN which begins when the output falls from Vcc to Vcc/2. The length of the pulse is set by logic delays in a pulse generator. The length of the pulse is designed to be long enough to keep the large driver transistor off for the second half of the voltage transition, and the period of time when the larger reflections are received. Separate pulse generators can be used for disabling the large pull-up and pull-down driver transistors to compensate for larger ground ringing or bounce, for example.

Schematic of Pulse-Disabled Output Buffer

Figure 5:
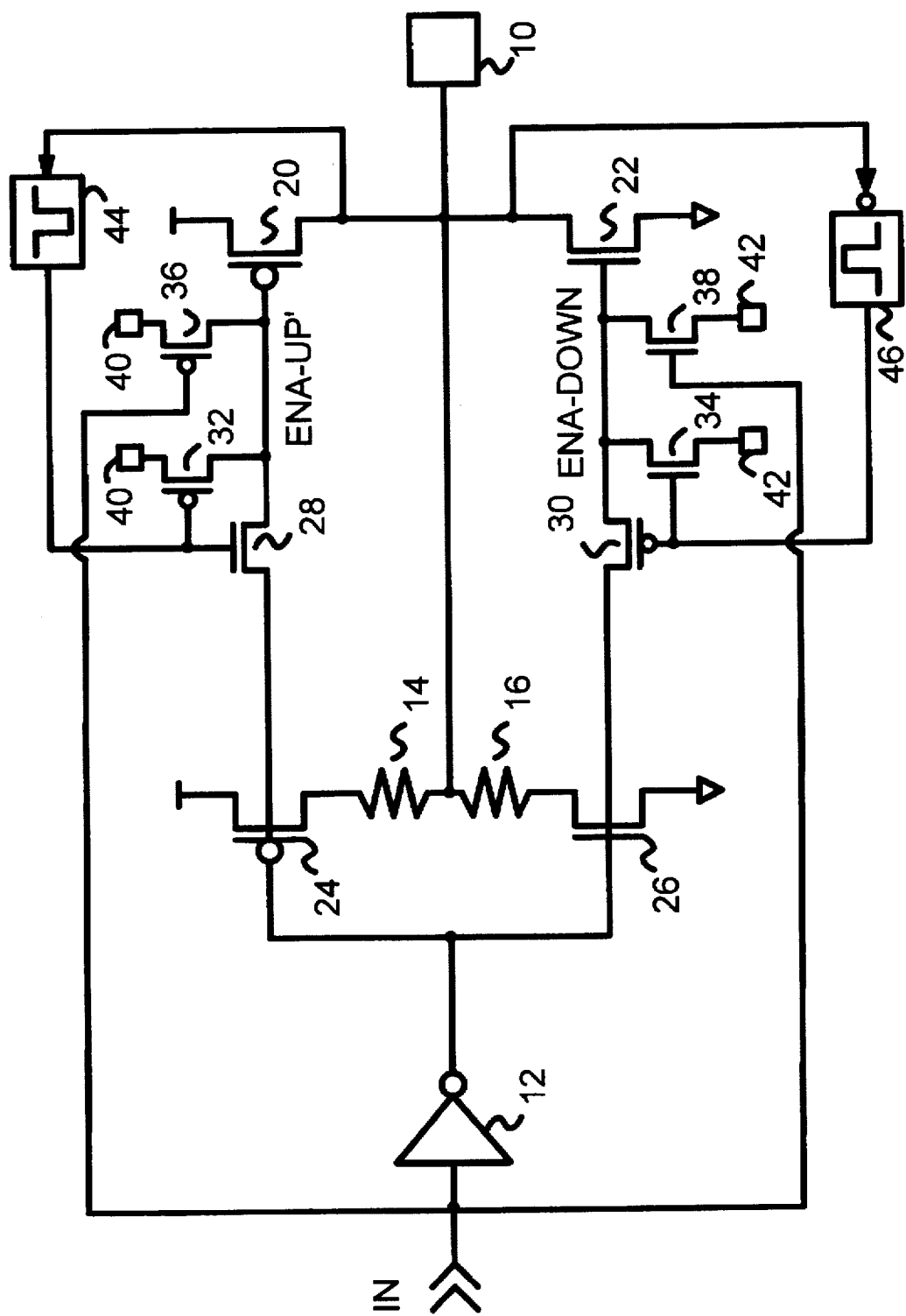
FIG. 5 is a schematic diagram of an output buffer which disables the larger driver transistors using pulse generators.

FIG. 5 is a schematic diagram of an output buffer which disables the larger driver transistors using pulse generators. The output buffer of FIG. 5 is similar to that of FIG. 3 and uses similar reference numbers on similar elements.

Feedback inverters 18, 19 of FIG. 3 are replaced with pulse generators. Pulse generator 44 generates a low-going pulse on the low-to-high transition of output pin 10. The low-going pulse is triggered at about the switching threshold, Vcc/2. The low-going pulse from pulse-generator 44 causes isolation transistor 28 to disconnect the gate of large driver transistor 20 from the input, while disable transistor 32 pulls its gate to quiet power supply 40. Thus large pull-up driver transistor 20 is turned off by the low-going pulse from pulse generator 44. At the end of the pulse, disable transistor 32 turns off again and isolation transistor 28 again connects the gate to the input, enabling large pull-up driver transistor 20 for supplying static current after the output's voltage swing has completed.

During the low-going pulse when large driver transistor 20 is disabled, small driver transistor 24 continues to pull the output to Vcc. Resistor 14 and transistor 24 provide active impedance to absorb any reflections. At the end of the pulse, large pull-up driver transistor 20 is again enabled, reducing the impedance. Thus the output buffer's impedance is switched by the pulse.

Pulse generator 46 generates a pulse on the high-to-low transition of output pin 10. The pulse is triggered at about the switching threshold, Vcc/2. The low pulse from pulse-generator 46 causes isolation transistor 30 to disconnect the gate of large driver transistor 22 from the input, while disable transistor 34 pulls its gate to quiet ground 42. Thus large pull-down driver transistor 22 is turned off by the pulse from pulse generator 46. At the end of the pulse, disable transistor 34 turns off again and isolation transistor 30 again connects the gate to the input, enabling large pull-down driver transistor 22 for supplying static current after the output's voltage swing has completed.

During the high-going pulse when large driver transistor 22 is disabled, small driver transistor 26 continues to pull the output to ground. Resistor 16 and transistor 26 provide active impedance to absorb any reflections. At the end of the pulse, large pull-down driver transistor 22 is again enabled, reducing the impedance.

Pulse generator 44 can be constructed from a NAND gate with one input connected to the input of pulse generator 44, and the other input connected to a string of inverters driven by the input of pulse generator 44. The string of inverters has an odd number of inverters and the delay through these inverters sets the width of the pulse. The delay can be increased by increasing the number of inverters in the string, or increasing the delay of some or all of the inverters. The odd number of inverters causes one input to the NAND gate to statically differ from the other input, but temporarily be the same as the pulse is being generated.

Pulse generator 46 can be constructed from a NOR gate with one input connected to the input of pulse generator 46, and the other input connected to a string of inverters driven by the input of pulse generator 46. The string of inverters also has an odd number of inverters and the delay through these inverters sets the width of the pulse.

Thus the pulse increases the output buffer's impedance by disabling the larger driver. Static current is still provided by the large driver since the pulse only disables the large driver for a short time.

Figure 6:
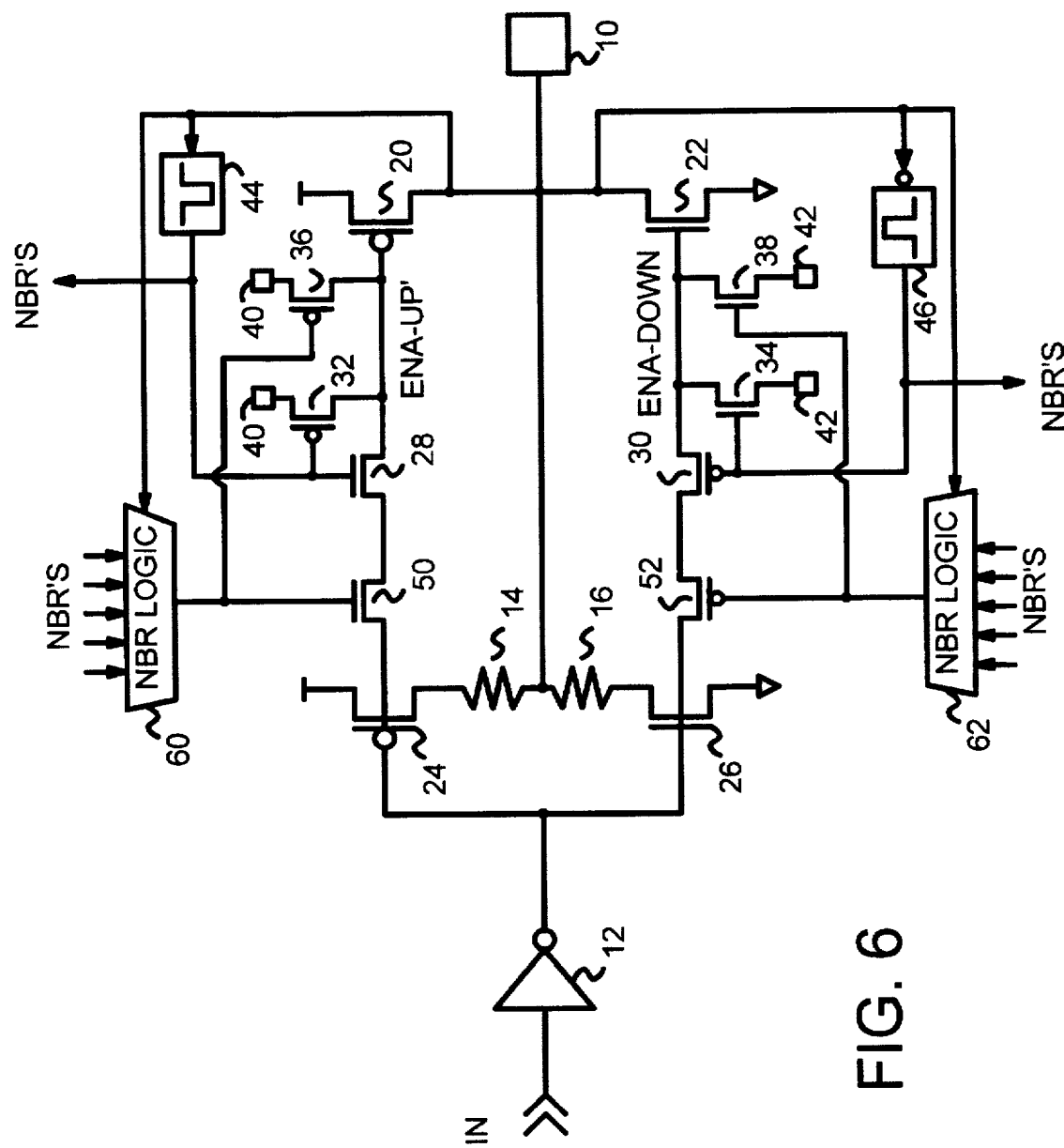
FIG. 6 is a schematic diagram of an output buffer which uses a pulse to disable its large driver transistors at the end of an output voltage transition, and also disables other neighboring output buffers.

Neighbor Sensing—FIG. 6

FIG. 6 is a schematic diagram of an output buffer which uses a pulse to disable its large driver transistors at the end of an output voltage transition, and also disables other neighboring output buffers. The output buffer of FIG. 6 operates in the same manner as described for FIG. 5, but the large driver transistors 20, 22 are also disabled when neighboring output buffers transition.

Neighboring output buffers which are switching can draw a great amount of current through the noisy power and ground supplies, causing power and ground bounce. This bounce can be coupled to a static output, causing unwanted fluctuation of the output voltage. The circuit of FIG. 6 detects when neighboring output buffers are switching and temporarily disables the large driver transistors in the output buffer. Although bounce in the noisy power and ground supplies can be coupled to output pin 10 through first-stage driver transistors 24, 26, the amount of coupling is smaller since first-stage driver transistors 24, 26 are smaller than second-stage driver transistors 20, 22. Resistors 14, 16 also significantly dampen any bounce on the supplies before reaching output pin 10.

Neighbor logic 60 receives low-going disable pulses from neighboring output buffers and drives neighbor isolation transistor 50 and neighbor disable transistor 36. Likewise, neighbor logic 62 receives high-going disable pulses from neighboring output buffers and drives neighbor isolation transistor 52 and neighbor disable transistor 38.

The low-going pulse generated from pulse generator 44 is sent to other neighboring output buffers, and any pulses from these neighboring buffers are received by neighbor logic 60. Neighbor logic 60 passes any of these pulses from neighboring pins through so that they can disable the large driver transistors, preventing noise from coupling into output pin 10 from the noisy power and ground supplies. The high-going pulse from pulse generator 46 is likewise sent to other neighboring pins, and these neighboring pins send their high-going pulses from their pulse generators to neighbor logic 62.

Neighbor sensing allows any output which is switching and injecting noise into the power or ground supplies to disable other output buffers for a short time. The same pulse generator is used to generate a pulse for isolating its own drivers and the neighbor's drivers. Neighbor logic 60, 62 on other pins disables the neighbor's drivers at about the same time as its own drivers are being disabled, since the same pulse is used. Thus the neighbor's drivers are isolated when the reflections and ringing occurs.

Figure 7:
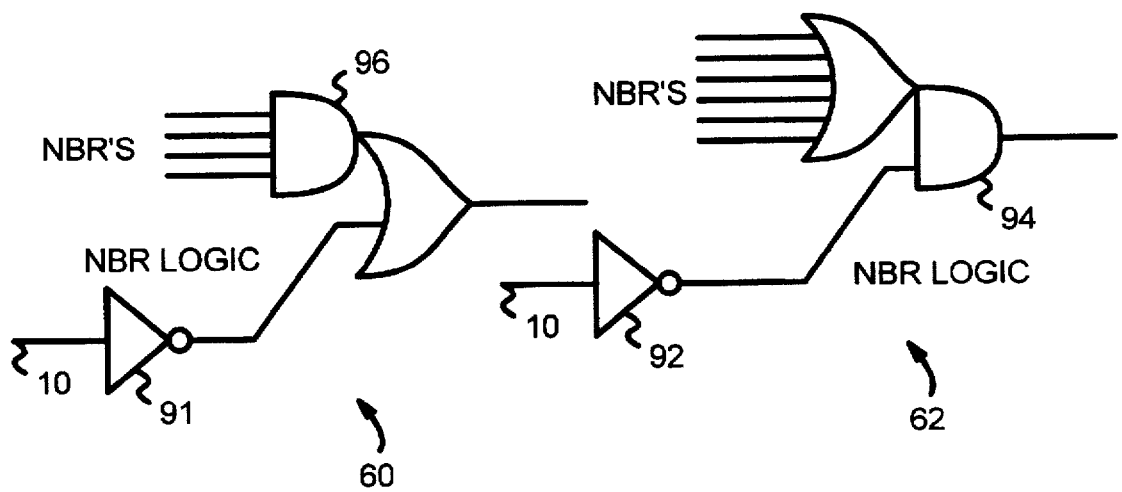
FIG. 7 is a diagram of neighbor logic for disabling adjacent outputs when one output switches.

Neighbor Logic—FIG. 7

FIG. 7 is a diagram of neighbor logic for disabling adjacent outputs when one output switches. Neighbor logic 60 disables the large pull-up driver. Neighbor logic 60 includes AND-OR gate 96 which AND's the low-going pulses together. All pulses are high except when switching its output from low to high. Any low pulse is passed through the AND portion of AND-OR gate 96 as a low to the OR portion. Any low-going pulses are blocked by the OR portion when the buffer's output pin 10 is in the opposite state of the switching buffer's output since output pin 10 is connected to the other OR input of AND-OR gate 96 through inverter 91.

Neighbor logic 62 is for disabling the large pull-down driver transistor. It includes OR-AND gate 94 which OR's the high-going pulses together. Any pulses are blocked when the output is in the opposite state of the switching since output pin 10 is inverted by inverter 92 and then connected to the other AND input of OR-AND gate 94. Thus only neighboring pulses which affect the supply connected to the source of the enabled driver are passed through neighbor logic 60, 62 to isolate the driver.

Figure 8:
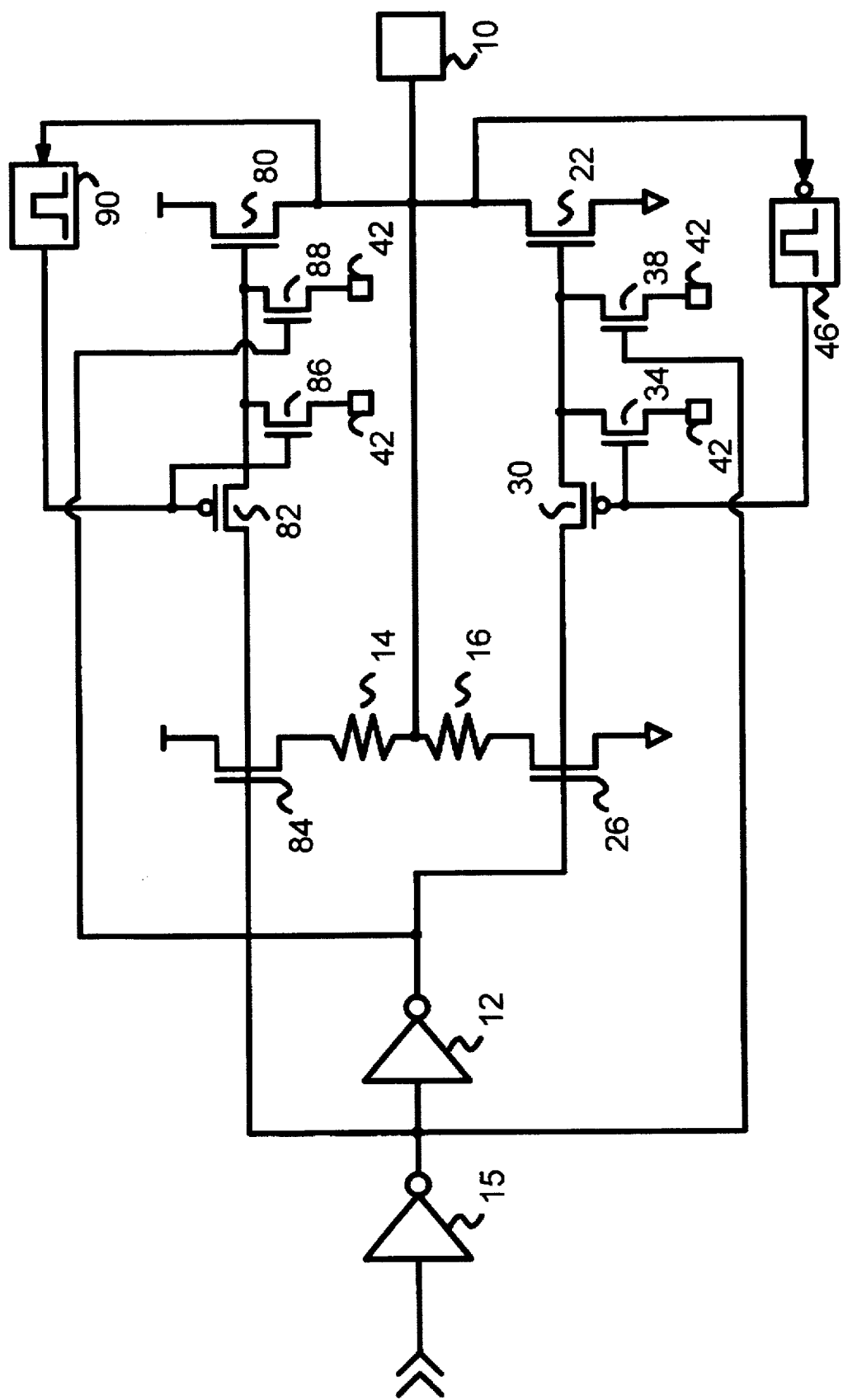
FIG. 8 is a diagram of an output buffer with pulse-disabled drivers with TTL-level output voltages.

TTL-Output embodiment—FIG. 8

FIG. 8 is a diagram of an output buffer with pulse-disabled drivers with TTL-level output voltages. FIG. 8 is similar to FIG. 5 except that the pull-up driver transistors 24, 20 are n-channel rather than p-channel devices. Since n-channel transistors can only pull up to a transistor threshold voltage below Vcc, the high output voltage is limited to Vcc–Vtn. The pull-up driver's isolation logic must be altered accordingly.

The input signal IN drives the gate of first-stage pull-up driver transistor 84, and also the gate of second-stage driver transistor 80 when isolation transistor 82 is conducting. Disable transistor 86 drives the gate of pull-up driver transistor 80 low when a high-going pulse is generated by pulse generator 90 as the output switches from low-to-high. Isolation transistor 82 isolates the gate during the high-going pulse. Disable transistor 88 drives the gate of driver transistor 80 low when the output is low or being driven low.

Other output buffers described herein can also be modified to use n-channel pull-up transistors for TTL-level outputs.

ALTERNATE EMBODIMENTS

Several other embodiments are contemplated by the inventor. For example the switching threshold of the feedback inverters can easily be changed from Vcc/2. The size (W/L, which determines current drive) of the pull-up transistor in the feedback inverter can be increased relative to the size of the pull-down transistor to raise the switching threshold above Vcc/2. Conversely, the pull-down may be increased in size to lower the switching threshold below Vcc/2. A voltage comparator with programmable reference voltages can also be used for a more flexible application. A single feedback inverter could be used to drive the isolation and disable transistors of both the pull-up and pull-down drivers, but having separate feedback inverters as shown in FIG. 3 allows the switching threshold to be adjusted separately. Thus is ground bounce on low-going transitions was more of a concern, the low-going pull-down driver could be turned off sooner by raising the switching threshold of the feedback inverter for the pull-down isolation. The higher switching threshold is reached earlier, thus shutting off the large pull-down driver sooner, reducing the output slew earlier.

TTL-level logic uses a switching threshold of about 1.45 volts rather than Vcc/2. TTL can be accommodated by adjusting the size of the pull-up and pull-down transistors in the feedback inverters, or using TTL-to-CMOS level converters. More complex feedback devices could be used instead of the feedback inverters shown. A schmitt trigger can be substituted to provide hysteresis. The delay through the feedback device can be increased or decreased with many different circuit techniques.

Control inputs can be added to modify the outputs buffers described herein for three-state or high-Z operation. When the entire buffer is disabled, both pull-up and pull-down transistors are disabled. Changing inverter 12 to a NAND gate driving the pull-ups and a NOR gate driving the pull-downs with additional disable circuitry for the second stage can accomplish this in a well-known manner.

The resistors in series with the smaller driver transistors can be implemented as diffusion resistors or as polysilicon resistors. Other technologies could also be used. The neighboring pins could be only the two immediately adjacent pins, or all pins sharing the same metal bus for power or ground, such as all pins on one side of a chip or between two ground pins.

Current may flow in either direction, as negative current can flow from ground to the power supply. Thus the pull-up can drive a positive current to the output while the pull-down can drive a negative current to the output. A single series resistor to the output can be used rather than two separate resistors as described.

The foregoing description of the embodiments of the invention has been presented for the purposes of illustration and description. It is not intended to be exhaustive or to limit the invention to the precise form disclosed. Many modifications and variation are possible in light of the above teaching. It is intended that the scope of the invention be limited not by this detailed description, but rather by the claims appended hereto.

I claim:

1. An impedance-switching output buffer comprising:
   a low-impedance stage for driving current to an output;
   a higher-impedance stage for driving current to the output;
   a pulse generator, coupled to the output, for generating a pulse when the current driven to the output by the low-impedance stage and the higher-impedance stage switches the output to a predetermined voltage between a ground voltage and a power-supply voltage;
   disable means, receiving the pulse from the pulse generator, for disabling the low-impedance stage in response to the beginning of the pulse and re-enabling the low-impedance stage in response to the end of the pulse;
   wherein both the low-impedance stage and the higher-impedance stage are enabled to drive current to the output after the end of the pulse,
   whereby static current is provided by both the low-impedance stage and the higher-impedance stage.

2. The impedance-switching output buffer of claim 1 wherein the low-impedance stage comprises:
   a pull-up MOS transistor connected to conduct current between a power supply and a the output; and
   a pull-down MOS transistor connected to conduct current between a ground supply and the output;
   and wherein the higher-impedance stage comprises:
   a first resistor connected between the output and to a first node;
   a second resistor connected between the output and to a second node;

a pull-up MOS transistor connected to conduct current between the power supply and the first node; and a pull-down MOS transistor connected to conduct current between the ground supply and the second node;

whereby the first resistor and the second resistor increase impedance of the output buffer and absorb reflections when the low-impedance stage is disabled by the pulse.

3. The impedance-switching output buffer of claim 2 wherein the disable means comprises:

isolation means, receiving the pulse, for disconnecting a control gate of the low-impedance stage from a control gate of the higher-impedance stage in response to the pulse;

tie off means, receiving the pulse, for driving a disabling voltage onto the control gate of the low-impedance stage, the disabling voltage preventing current from flowing through the low-impedance stage to the output, whereby the low-impedance stage is isolated and disabled by the pulse.

4. The impedance-switching output buffer of claim 3 further comprising:

neighbor logic means, receiving neighbor pulses from neighboring output buffers, the neighboring output buffers including means for generating neighbor pulses when a neighboring output switches to the predetermined voltage between the ground voltage and the power-supply voltage, the neighbor logic means outputting a neighbor switching pulse when one or more of the neighbor pulses is received;

neighbor isolation means, coupled to receive the neighbor switching pulse from the neighbor logic means, for disconnecting the control gate of the low-impedance stage from the control gate of the higher-impedance stage in response to the neighbor switching pulse;

neighbor tie off means, receiving the neighbor switching pulse, for driving the disabling voltage onto the control gate of the low-impedance stage, the disabling voltage preventing current from flowing through the low-impedance stage to the output, whereby the low-impedance stage is isolated and disabled by the neighbor switching pulse when a neighboring output buffers switches.

5. The impedance-switching output buffer of claim 4 wherein the end of the pulse occurs less than 10 nanoseconds after the beginning of the pulse, whereby the pulse is sufficiently long to disable the low-impedance stage during ringing after the output reaches the power-supply voltage or the ground voltage.

6. The impedance-switching output buffer of claim 4 wherein the neighbor logic means comprises an OR gate.

7. A reduced-noise output buffer comprising:

an output pin coupled to an external pin of an integrated circuit (IC) package, the external pin for connecting to a wiring trace generating a reflection back to the external pin;

a pull-up driver transistor for driving a first large current to the output pin from a first power supply, the pull-up driver transistor having a first control gate;

a pull-down driver transistor for driving a second large current to the output pin from a first ground supply, the pull-down driver transistor having a second control gate;

a pull-up impedance transistor for driving a first small current to the output pin from the first power supply, the pull-up impedance transistor having a third control gate;

a pull-down impedance transistor for driving a second small current to the output pin from the first ground supply, the pull-down impedance transistor having a fourth control gate;

wherein the first large current is larger than the first small current and wherein the second large current is larger than the second small current, the pull-up impedance transistor and the pull-down impedance transistor presenting a higher impedance to the output pin than the pull-up driver transistor and the pull-down driver transistor;

pull-up feedback means, responsive to the output pin, for generating a pull-up isolation signal when the output pin has switched from ground to a predetermined voltage between the first power supply and the first ground supply;

pull-up isolation means, for isolating the first control gate from the third control gate and disabling the pull-up driver transistor when the pull-up isolation signal is generated by the pull-up feedback means;

pull-down feedback means, responsive to the output pin, for generating a pull-down isolation signal when the output pin has switched from the first power supply to a second predetermined voltage between the first power supply and the first ground supply;

pull-down isolation means, for isolating the first control gate from the third control gate and disabling the pull-down driver transistor when the pull-down isolation signal is generated by the pull-down feedback means;

wherein the pull-up feedback means comprises a first pulse generator for generating a pulse as the pull-up isolation signal, the pulse temporarily isolating the pull-up driver transistor as the output pin reaches the first power supply, the pulse sufficiently long in duration to disable the pull-up driver transistor while the reflection from the wiring trace is returned to the external pin;

and wherein the pull-down feedback means comprises a second pulse generator for generating a second pulse as the pull-down isolation signal, the second pulse temporarily isolating the pull-down driver transistor as the output pin reaches the first ground supply, the second pulse sufficiently long in duration to disable the pull-down driver transistor while the reflection from the wiring trace is returned to the external pin, whereby higher impedance to the output pin is provided by the pull-up impedance transistor or the pull-down impedance transistor when the pull-up driver transistor and the pull-down driver transistor are disabled and isolated by the pull-up or pull-down isolation signal, the higher impedance for absorbing and reducing noise, and whereby the driver transistors are isolated and disabled while the reflection is returned.

8. The reduced-noise output buffer of claim 7 wherein:

the pull-up isolation means comprises a MOS transistor with a control gate coupled to the pull-up isolation signal; and the pull-down isolation means comprises a MOS transistor with a control gate coupled to the pull-down isolation signal.

9. The reduced-noise output buffer of claim 8 wherein:

the pull-down impedance transistor comprises a MOS transistor;

the reduced-noise output buffer further comprising:

a resistor in series with the MOS transistor of the pull-down impedance transistor, the resistor for increasing the impedance presented to the output pin;

whereby impedance is increased by the resistor.

10. The reduced-noise output buffer of claim 8 wherein the pull-up isolation means is coupled to a quiet power supply coupled to a separate pin of the IC package than the first power supply and the pull-down isolation means is coupled to a quiet ground supply coupled to a separate pin of the IC package than the first ground supply, whereby separate supplies are used for isolation circuitry.

11. The reduced-noise output buffer of claim 10 wherein:

the pull-up isolation means further comprises a disable transistor with a control gate coupled to the pull-up isolation signal, the disable transistor conducting current from the quiet power supply to the first control gate of the pull-up driver transistor to disable the pull-up driver transistor when the pull-up isolation signal is pulsed; and the pull-down isolation means further comprises a disable transistor with a control gate coupled to the pull-down isolation signal, the disable transistor conducting current from the quiet ground supply to the second control gate of the pull-down driver transistor to disable the pull-down driver transistor when the pull-down isolation signal is pulsed, whereby the quiet power and ground supplies are used to disable the driver transistors.

12. The reduced-noise output buffer of claim 11 further comprising:

neighbor isolation means, receiving isolation pulses from other output buffers driving external pins of the IC package when the external pins are being switched by one of the other output buffers, the neighbor isolation means disabling the pull-up driver transistor or the pull-down driver transistor in response to the isolation pulses, whereby noise is reduced by disabling the driver transistors when other output buffers switch.

13. The reduced-noise output buffer of claim 12 wherein the neighbor isolation means comprises:

pull-up neighbor disable means, receiving isolation pulses when one of the other output buffers switches an external pin to the first power supply, the pull-up neighbor disable means disabling the pull-up driver transistor when the output pin is at the first power supply;

pull-down neighbor disable means, receiving isolation pulses when one of the other output buffers switches an external pin to the first ground supply, the pull-down neighbor disable means disabling the pull-down driver transistor when the output pin is at the first ground supply, whereby the pull-up and pull-down driver transistors are separately isolated.

14. A CMOS output buffer for driving an external wiring trace comprising:

an output for driving current to the external wiring trace;

an input;

a primary stage having:

a pull-up driver transistor having a gate for controlling current from a noisy power supply to the output;

a pull-down driver transistor having a gate for controlling current from a noisy ground supply to the output;

a secondary stage connected to the input having:

a pull-up transistor having a gate coupled to the input for controlling current from the noisy power supply to the output, the pull-up transistor having a higher impedance than the pull-up driver transistor;

a pull-down transistor having a gate coupled to the input for controlling current from the noisy ground supply to the output the pull-down transistor having a higher impedance than the pull-down driver transistor;

a first isolation transistor having a gate for isolating the gate of the pull-up driver transistor from the gate of the pull-up transistor;

a first disable transistor for driving a disabling voltage onto the gate of the pull-up driver transistor;

a second isolation transistor having a gate for isolating the gate of the pull-down driver transistor from the gate of the pull-down transistor;

a second disable transistor for driving a disabling voltage onto the gate of the pull-down driver transistor;

a first pulse generator for generating a first disabling pulse to the first disable transistor and to the gate of the first isolation transistor when the output is switching and has risen in voltage by a predetermined voltage, the first disabling pulse causing the first isolation transistor to isolate the gate of the pull-up driver transistor from the gate of the pull-up transistor, the first disabling pulse also causing the first disable transistor to drive the disabling voltage to the gate of the pull-up driver transistor; and a second pulse generator for generating a second disabling pulse to the second disable transistor and to the gate of the second isolation transistor when the output is switching and has fallen in voltage by a second predetermined voltage, the second disabling pulse causing the second isolation transistor to isolate the gate of the pull-down driver transistor from the gate of the pull-down transistor, the second disabling pulse also causing the second disable transistor to drive the disabling voltage to the gate of the pull-down driver transistor, whereby the primary stage is disabled by the first or second disabling pulse after the output has reached a predetermined voltage.

15. The CMOS output buffer of claim 14 wherein:

the pull-up transistor and the pull-up driver transistor are each p-channel MOS transistors with sources connected to the noisy power supply; and the pull-down transistor and the pull-down driver transistor are each n-channel MOS transistors with sources connected to the noisy ground supply, whereby both the primary and secondary stages are connected to the noisy supplies.

16. The CMOS output buffer of claim 15 further comprising:

first pulse generators in other output buffers on a same die for generating neighbor pull-up pulses when another output buffer switches another output to the noisy power supply;

second pulse generators in other output buffers on the same die for generating neighbor pull-down pulses when another output buffer switches another output to the noisy ground supply;

a first neighbor isolation transistor having a gate for isolating the gate of the pull-up driver transistor from the gate of the pull-up transistor, the gate connected to receive the neighbor pull-up pulses;

a first neighbor disable transistor for driving a disabling voltage onto the gate of the pull-up driver transistor when the neighbor pull-up pulses are received;

a second neighbor isolation transistor having a gate for isolating the gate of the pull-down driver transistor from the gate of the pull-down transistor, the gate connected to receive the neighbor pull-up pulses;

a second neighbor disable transistor for driving a disabling voltage onto the gate of the pull-down driver transistor when the neighbor pull-down pulses are received, whereby other output buffers disable the pull-up driver transistor or the pull-down driver transistors when another output is switched.

17. The CMOS output buffer of claim 16 wherein:

the pull-up driver transistor has a drain connected to the output;

the pull-down driver transistor has a drain connected to the output;

the pull-up transistor has a drain connected to the output through a resistor;

the pull-down transistor has a drain connected to the output through a resistor, whereby the secondary stage has resistors which increase impedance.

* * * * *